United States Patent [19]

Schmalbein et al.

[11] Patent Number: 5,397,988
[45] Date of Patent: Mar. 14, 1995

[54] METHOD AND DEVICE FOR TUNING A HF SOURCE, IN PARTICULAR FOR TUNING A MICROWAVE SOURCE OF AN ELECTRON SPIN RESONANCE SPECTROMETER

[75] Inventors: Dieter Schmalbein, Marxzell-Burbach, Germany; Károly Holczer, Orsay, Hungary; Viktor Ringeisen, Riedseltz, France

[73] Assignee: Bruker Analytische Messtechnik GmbH, Rheinstetten-Forchheim, Germany

[21] Appl. No.: 924,559

[22] Filed: Jul. 31, 1992

[30] Foreign Application Priority Data

Aug. 2, 1991 [DE] Germany ............ 41 25 592.5

[51] Int. Cl.⁶ .......................................... G01R 33/20
[52] U.S. Cl. ........................................ 324/316
[58] Field of Search ............ 324/316, 300, 313, 314; 333/219, 219.2, 219.1

[56] References Cited

U.S. PATENT DOCUMENTS

| | | | |
|---|---|---|---|
| 3,798,532 | 3/1974 | Hausser | 324/316 |
| 3,798,553 | 3/1974 | Sakamoto | 325/453 |
| 3,829,760 | 8/1974 | Bozanic et al. | 324/316 |
| 4,544,902 | 10/1985 | Harris | 333/250 |

FOREIGN PATENT DOCUMENTS 961992 3/1953 Germany .
1144838 5/1961 Germany .

OTHER PUBLICATIONS

Electron Spin Resonance, Second Edition, A Comprehensive Treatise on Experimental Techniques by Charles P. Poole, Jr., pp. 87, 88, 89, 96, 97, 622 (1983).

Primary Examiner—Kenneth A. Wieder
Assistant Examiner—Raymond Y. Mah
Attorney, Agent, or Firm—Claude A. S. Hamrick

[57] ABSTRACT

A method and a device for tuning a HF source, which oscillates at a basic frequency, to a narrow-band component, in particular for tuning a microwave source 61 of an electron spin resonance spectrometer to a resonator 62. In order to mutually tune the resonance frequency $F_R$ of the resonator 62 and the basic frequency $f_O$ of the source 61, the output signal of the source 61 is mixed in a mixer 64 with a sweep signal of an oscillator 65. The behavior of the resonator 62 is observed on a visual display unit 67, via a detector 68, in the form of what is called a "mode curve", and the source 61 is re-tuned so that two dips in the mode curve are brought into coincidence.

14 Claims, 5 Drawing Sheets

METHOD AND DEVICE FOR TUNING A HF SOURCE, IN PARTICULAR FOR TUNING A MICROWAVE SOURCE OF AN ELECTRON SPIN RESONANCE SPECTROMETER

BACKGROUND OF THE INVENTION

The present invention relates to a method for, tuning a HF source, which oscillates at a basic frequency, to a narrow-band component, in particular for tuning a microwave source of an electron spin resonance spectrometer to a resonator, comprising the procedural steps of
tuning periodically the frequency of the HF signal supplied to the narrow-band component over a predetermined tuning range;
detecting a first signal corresponding to the power of the HF signal absorbed by the narrow-band component;
plotting the first signal as a function of the frequency within the tuning range in a manner such that the narrow-band power absorption range becomes visible as a mark in the representation of the first signal; and
resetting the basic frequency so that the mark comes to lie substantially at the center of the tuning range.

The present invention further relates to a device for tuning a HF source, which oscillates at a basic frequency, to a narrow-band component, in particular for tuning a microwave source of an electron spin resonance spectrometer to a resonator, having
first means for tuning periodically the frequency of the HF signal supplied to the narrow-band component over a predetermined tuning range;
second means for detecting a first signal corresponding to the power of the HF signal absorbed by the narrow-band component;
third means for plotting the first signal as a function of the frequency within the tuning range in a manner such that the narrow-band power absorption range becomes visible as a mark in the representation of the first signal; and
fourth means for resetting the basic frequency so that the mark comes to lie substantially at the center of the tuning range.

A method and a device of the before-described kind have been known.

Electron spin resonance spectrometers of the conventional type usually use a reflex klystron as a microwave source. As is generally known, a reflex klystron is a component which enables the frequency of the output signal to be varied in two ways. On the one hand, coarse tuning of the frequency is possible by varying the volume of the resonator in the klystron, for example by means of a screw which is accessible from the outside. On the other hand, however, fine tuning of the klystron is possible by varying the reflector voltage.

If one now regards, by way of example, a reflex klystron oscillating in the X-band, it is possible in this case to obtain a tuning range of several 100 MHz with the usual mechanical tuning procedure, whereas electric fine tuning through the reflector voltage is limited to a tuning range of a few 10 MHz.

In the case of the before-mentioned application of electron spin resonance spectrometers, the microwave source feeds a resonator, which usually is designed as a cavity resonator. Cavity resonators have a very high unloaded Q in the unloaded condition so that tuning of the resonator to the microwave source, or vice versa, does not present any particular problems.

Now, it is a particularity of electron spin resonance spectrometers that their cavity resonators are loaded with samples. As long as the samples in question are solid samples having only low dielectric losses, the dielectric properties of the cavity resonator are not influenced significantly, which means that neither its oscillating frequency nor its Q value will vary substantially. Tuning is, therefore, connected with little problems in these cases.

Greater tuning problems are encountered, however, when instead of solid samples liquid samples with correspondingly high dielectric losses are to be measured, since introduction of such dissipative samples leads to quite significant variations in both the resonance frequency of the resonator and its Q value.

In order to enable the microwave source and the resonator to be mutually tuned also in these cases it is necessary to make full use of the mechanically tunable range of reflex klystrons, for example.

In the case of conventional electron spin resonance spectrometers, one proceeds for this purpose as follows:

Once the sample has been introduced into the resonator, the klystron is switched on, and this initially in an operating mode which only serves for mutual tuning of the klystron and the resonator. In this operating mode, the reflector voltage of the klystron is periodically tuned by means of a saw-tooth voltage. At the same time, the power absorption in the resonator is measured by tapping a corresponding diode current at the microwave detector—containing the resonator—of the microwave bridge that is anyway provided.

The saw-tooth voltage serves simultaneously for setting the horizontal deflection of a visual display unit, typically a cathode-ray tube. The vertical deflection is then supplied with a signal corresponding to the diode current. This has the result that a so-called "mode curve" appears on the visual display unit, i.e. a bell-shaped curve representing the power output of the klystron across the tuning range that can be covered by varying the reflector voltage. Now, when the resonance frequency of the resonator loaded with the sample is within the tuning range, this is indicated by an incision in the bell-shaped mode curve. The incision may be inside or outside of the maximum of the mode curve, which means that the resonator is not supplied with the maximally possible microwave power. On the other hand, however, the shape of the incision, in particular its width and its depth, provide a measure for the resonator Q and for the Q value of the resonator coupling circuit.

By mechanically adjusting the klystron it is now possible to displace the entire mode curve until the incision comes to lie at the center of the mode curve and, thus, in the maximum of the possible power output of the klystron. The same procedure is possible by analogy if, when switching on the spectrometer, the resonance of the resonator loaded with a sample is completely outside of the electric tuning range, as indicated by the mode curve on the visual display unit. In this case, one can initially proceed to mechanically detune the klystron with a view to finding the resonance point of the resonator which will then, during mechanical tuning of the klystron, move from the one or from the other side of the mode curve into the displayed image where it can then be centered in the manner described above.

The above procedure can of course also be automated; the above description has been given only for the sake of greater clarity.

As microwave component technology progressed, one has made numerous attempts at replacing the conventional microwave tubes, i.e. in particular the before-mentioned klystron, by semiconductor oscillators, in particular by Gunn oscillators. This measure was intended to eliminate the relatively complex circuitry of microwave tubes, i.e. the extremely high reflector voltages, the tube heating, and the like, with all the relevant thermic problems.

However, microwave semiconductor oscillators are not suited without qualifications for replacing microwave tubes in electron spin resonance spectrometers.

With Gunn oscillators, for example, it is not possible to tune them electrically over a wider frequency range of several 10 MHz, the tuning range of such oscillators being limited today to clearly less than 10 MHz. However, this relatively small tuning range is insufficient in those cases of electron spin resonance measurements where the resonator Q has been diminished so considerably that the effective bandwidth of the resonator has moved to a range of 10 MHz or above. It is then of course no longer possible to obtain a conventional mode curve, the electric tuning range of a Gunn oscillator being insufficient to cover the relatively wide bandwidth of the resonator loaded with the sample.

One has of course also considered in this connection to make use of the possibility, which in fact exists, of tuning Gunn oscillators mechanically, by varying the length of the resonator of the Gunn oscillator. While in principle such variation can be achieved by means of magnetostrictive or electrostrictive elements, or by electrodynamically excited diaphragm arrangements, trials in this direction have been little promising in practice, and this in particular due to the associated generation of noise.

SUMMARY OF THE INVENTION

Now, it is the object of the present invention to improve a method and a device of the before-described type in such a way as to achieve, by purely electrical means, a wide tuning range for microwave sources, including semiconductor sources, enabling even resonators with very dissipative samples to be tuned jointly with the microwave source.

According to the before-described method, the invention achieves this object by the fact that for periodically tuning the frequency the output signal of the HF source is mixed with a sweep signal.

According to the before-described device, the object according to the invention is achieved by the fact that the first means comprise a mixer connected to the output of the HF source, whose other input is connected to a periodically tunable oscillator which latter is controlled by a sweep generator.

The object underlying the present invention is fully solved in this way. By making use of an artifice, i.e. the described mixing of the output signal of the HF source, it is rendered possible to supply the narrow-band component, in the described application the resonator, with a microwave signal which can be electrically tuned over broad ranges, without regard to the particular nature of the HF or microwave source.

Thus, it is also possible in this way to make use of microwave sources for which originally electrical tuning is possible only within very narrow ranges.

For the measurement as such, for example the electron spin measurement, the tuning device is then no longer needed as the frequency of the microwave source on the one hand and the resonator loaded with the sample on the other hand must be tuned only once during the tuning process, while the subsequent measurement is then carried out at constant measuring frequency of the microwave source.

According to preferred further developments of the device according to the invention, the sweep generator has its output further connected, in a manner known as such, to a horizontal deflection circuit of a visual display device whose vertical deflection circuit can be supplied with the first signal.

Now, according to a first variant, the sweep generator can feed the tunable oscillator and the visual display unit with the same output signal.

This manner of proceeding would correspond to the conventional electron spin resonance spectrometer.

According to another preferred variant of the invention, however, the sweep generator feeds a second signal of higher frequency to the tunable resonator, and a third signal of lower frequency, preferably half that frequency, to the visual display unit. The deviation of the sweep signal is determined, according to the method, by a periodical control signal, and the deviation range in the diagram is run through at least twice.

These features provide the advantage that continuous tuning is rendered possible insofar as the resonance incision appears twice, once as direct and once as mirrored representation, and tuning can be effected by bringing the two incisions into coincidence on the display.

According to a particularly simple solution, corresponding to the conventional manner of representation, this is effected by the fact that the second signal of higher frequency is a triangular signal and the third signal of lower frequency is a saw-tooth signal, the lower inversion point of the triangular signal being synchronized with the middle of the rising flank of the saw-tooth signal. This has the result, according to the method, that the deviation zero point coincides with the center of the diagrammatic representation.

This feature provides the advantage that the diagrammatic representation of the tuning process corresponds almost fully to that of conventional tuning arrangements which have been explained in detail above.

It has been noted before that while the invention can be used quite generally for tuning HF sources to narrow-band components, a particularly preferred application is seen in electron spin resonance spectroscopy, in particular in connection with spectrometers using semiconductor oscillators, preferably Gunn oscillators, as microwave source. The following description of certain embodiments of the invention, therefore, refers generally to this embodiment of the invention without, however, thereby limiting the scope of the present invention.

Other advantages of the invention will appear from the specification and the attached drawing.

It is understood that the features that have been mentioned before and that will be described hereafter may be used not only in the stated combinations, but also in any other combination or each alone, without departing from the scope of the present invention.

BRIEF DESCRIPTION OF THE DRAWING

Some embodiments of the invention will now be described in more detail with reference to the drawing in which.

DESCRIPTION OF THE PREFERRED EMBODIMENTS

Figure 1:
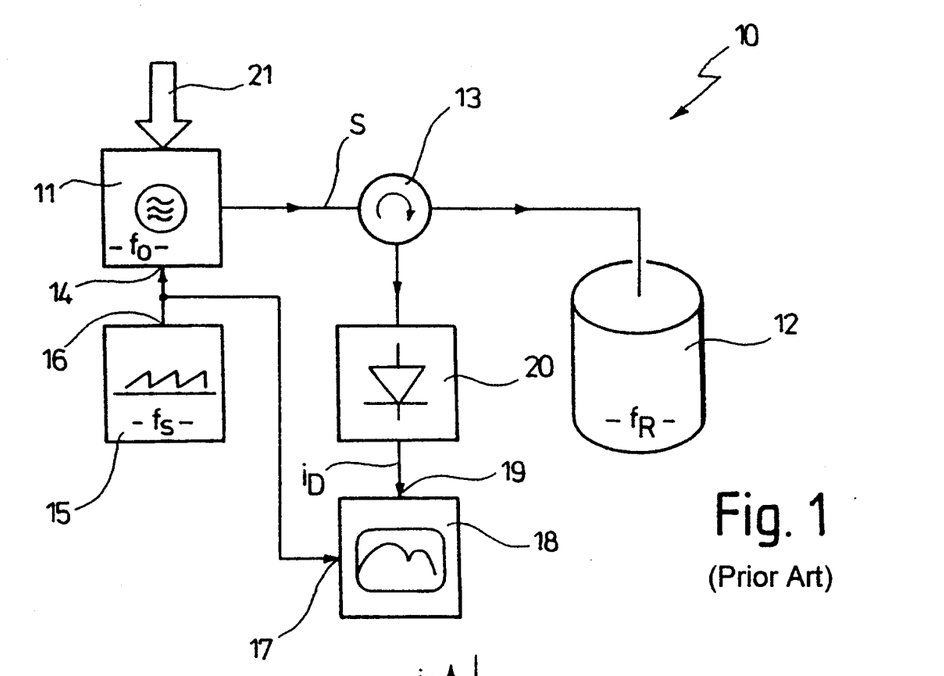
FIG. 1 shows a block diagram of a tuning arrangement of a conventional electron spin resonance spectrometer.

In FIG. 1, a microwave circuit arrangement of the kind preferably used in an electron spin resonance spectrometer is indicated generally by reference numeral 10.

The microwave circuit arrangement 10 comprises a microwave source 11 feeding a microwave resonator 12 via a circulator 13. The circulator 13 and the before-mentioned elements form together a microwave bridge.

The microwave source 11 can be varied electrically with respect to its basic frequency $f_O$ via a frequency control input 14. This is effected by a sweep generator 15, i.e. a generator which generates, at an output 16, a saw-tooth control voltage of a frequency $f_S$.

As said before, the output 16 is connected on the one hand to the frequency control input 14 of the microwave source 11, but on the other hand also to a horizontal input 17 of a visual display unit 18. The latter's vertical input 19 communicates with a detector 20 which in its turn is also connected to the circulator 13. The detector 20 generates a diode current signal $i_D$ being a measure of the amount of power absorbed by the microwave resonator 12 from the microwave source 11.

The microwave source 11 is further provided with mechanical frequency setting means 21 enabling the frequency of the microwave source 11 to be coarsely tuned.

Usually, arrangements 10 according to the prior art, as illustrated in FIG. 1, make use of reflex klystrons as microwave sources 11. The frequency control input 14 represents in this case the control electrode of the reflector by means of which the frequency can be varied electrically over a relatively narrow tuning range, by influencing the reflector voltage. The frequency setting feature 21, in contrast, represents the mechanical tuning feature of a reflex klystron which permits tuning over substantially greater frequency ranges.

In the case of the arrangement 10 illustrated in FIG. 1 the microwave resonator has a frequency $f_R$.

If no coincidence exists between the values $f_R$ and $f_O$, the frequency must be tuned in order to enable the arrangement to be operated.

One switches on for this purpose the sweep generator 15 so that the microwave source 11 is modulated in beat with the saw-tooth voltage, i.e. at the frequency $f_S$. The variation of the output frequency of the microwave source 11 of course has the result that more or less energy is reflected by the microwave resonator 12. One therefore obtains, at the output of the detector 20, the signal $i_D$ illustrated in FIG. 2 in the form of what is known as a mode curve 30. The mode curve 30 represents the output signal $i_D$ of the detector 20, plotted against the ordinate, and the frequency, plotted against the abscissa. The mode curve 30 has a bell-like form because, as has been mentioned before, the microwave source 11 can be electrically tuned only over a relatively narrow tuning range.

Figure 2:
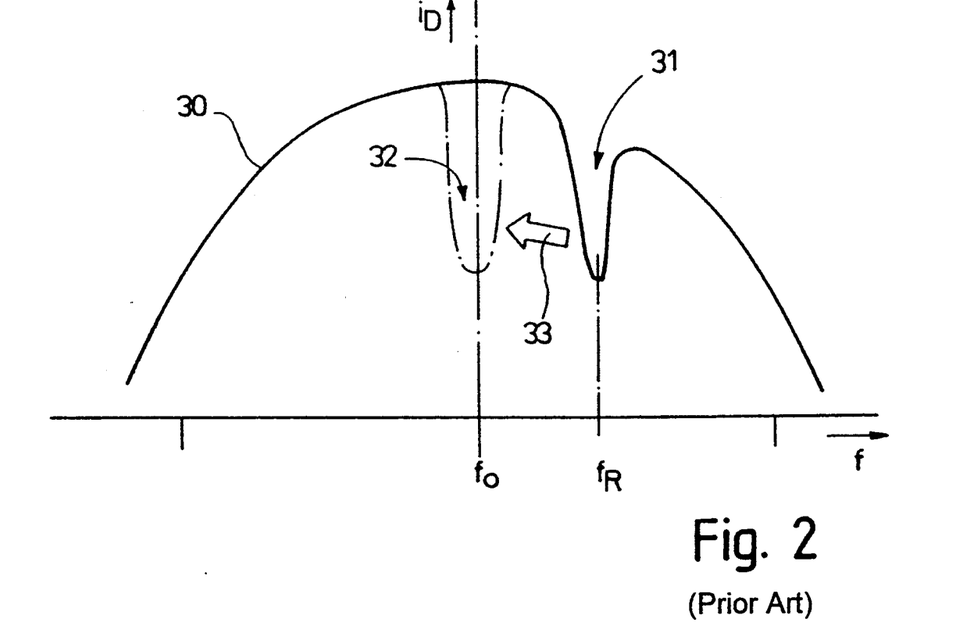
FIG. 2 shows a mode curve of the type generated with the arrangement according to FIG. 1.

Now, when the resonance frequency $f_R$ of the microwave resonator 12 is within the tuning range, as indicated in FIG. 2 by full lines, an incision 31 (known as "dip") develops at this frequency $f_R$ at the frequency spacing from the basic frequency $f_O$ of the microwave source 11. The frequency spacing of the dip 31 from the basic frequency $f_O$ means that the microwave resonator 12 is not operating at its power maximum. One therefore tunes the microwave source 11, via the coarse frequency setting means 21, in such a way as to bring the basic frequency $f_O$ into coincidence with the resonance frequency $f_R$, as illustrated by the dip 32 indicated by dash-dotted lines in FIG. 2. In the display image, i.e. in the image on the screen of the visual display unit 18, this has the effect that the dip 31 moves in the direction of arrow 33 in FIG. 2 until it reaches the central position (dip 32).

As has been said before, the discussed arrangement according to the prior art has a tuning range corresponding to the width of the mode curve shown in FIG. 2. For conventional microwave components, such as reflex klystrons, this tuning range is equal to several 10 MHz, a value which is sufficient for usual electron spin resonance measurements.

However, when a semiconductor oscillator, for example a Gunn oscillator, is selected as microwave source 11, then this broad tuning range no longer exists because oscillators of this type can be tuned only over a frequency range clearly below 10 MHz.

On the other hand, the dip 31 illustrated in FIG. 2 may be much broader if heavily dissipative samples are involved, and may even get almost as wide as the whole mode curve 30. It will be appreciated that in any such case the whole width of several 10 MHz of the mode curve 30 according to FIG. 2 will be required to enable the "dip" to be detected and to be centered by purposeful adjustment of the frequency.

Figure 3:
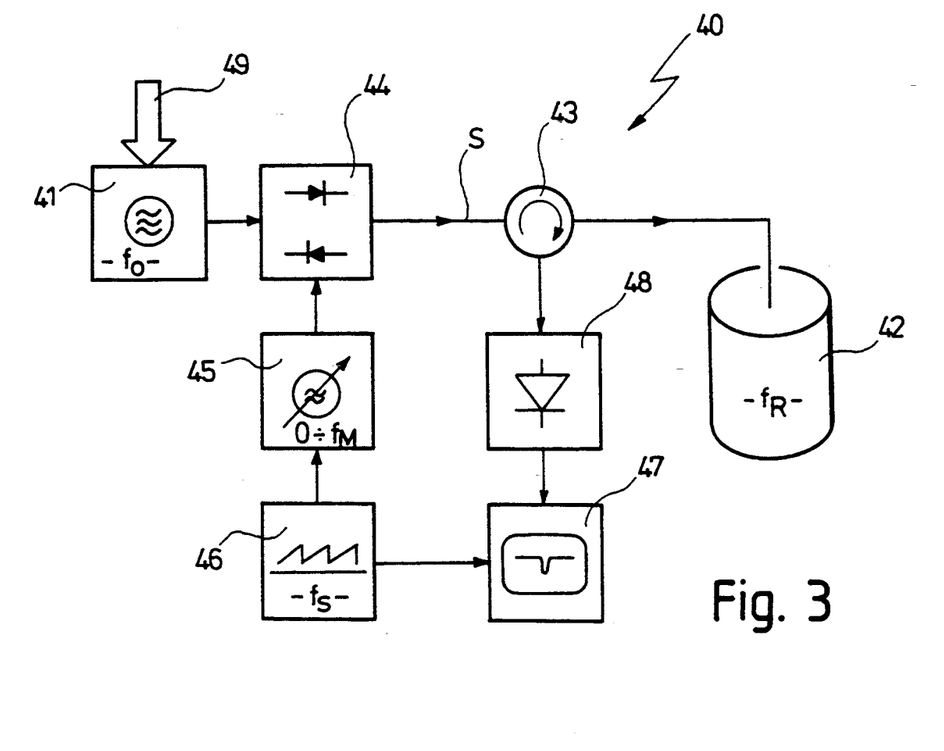
FIG. 3 shows a block diagram similar to that of FIG. 1, but for a first embodiment according to the invention.

FIG. 3 now shows another block diagram for a microwave circuit arrangement 40 according to the present invention.

Here again, a microwave source 41 feeds a microwave resonator 42 via a circulator 43.

This arrangement includes, however, a mixer 44 between the microwave source 41 and the circulator 43. The mixer 44 has one of its inputs connected to the microwave source 41 and its other input to a tunable oscillator 42. The tunable oscillator 45 can be electrically tuned in a frequency range between 0, i.e. direct voltage, and an upper threshold frequency $f_M$. Oscillators of this kind are also known as sweep generators.

The oscillator 45 is driven by a sweep generator 46 corresponding to the sweep generator 15 of FIG. 1. The latter again is connected to a visual display unit 47 which likewise communicates with a detector 48, the latter in its turn being connected to a third gate of the circulator 42.

The circuit arrangement 40 according to FIG. 3, therefore, largely corresponds to the circuit arrangement 10 according to FIG. 1, with the important exception that there are provided a mixer 44 and a tunable oscillator 45 driving the latter.

Figure 4:
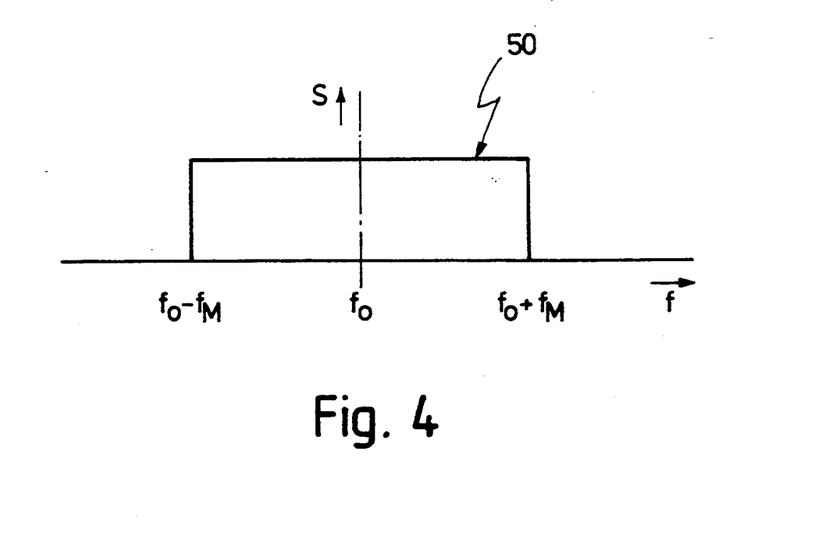
FIG. 4 shows a diagrammatic representation of the frequency range relevant for the embodiment according to FIG. 3.

For improved understanding, FIG. 4 shows a frequency band 50 for an output signal S of the mixer 44.

When tuning the tunable oscillator 45 between its threshold frequencies, i.e. between 0 and $f_M$, the frequency band 50 illustrated in FIG. 4 is run through. For the sake of clarity, it is important in this connection to realize that the microwave source 41 oscillates, for example, in the range of 9.6 GHz, i.e. in the X-band, whereas the tunable oscillator 45 has an upper threshold frequency $f_M$ being equal to approximately 50 MHz and, thus, being by three orders of magnitude lower. Compared with this, the repetition frequency $f_S$ of the sweep resonator 46 is, for example, equal to 50 Hz and, thus, once more lower by another 6 orders of magnitude.

Now, when the output frequency of the oscillator 45 is set at zero, only one isolated line appears at the axis of coordinates. When the frequency of the oscillator 45 is slowly increased, this line splits up into two partial lines extending right and left of the central frequency $f_O$, i.e. the basic frequency of the microwave source 41. This is so because mixing in the mixer 44 always leads to two mixing products, namely $f_O+f$ and $f_O-f$, where f is the frequency to which the oscillator 45 is set at any time. The conditions, therefore, can be generally imagined as follows: When the frequency of the oscillator 45 is varied very slowly, i.e. when the repetition frequency $f_S$ is very low, there will always be a central line at the basic frequency $f_O$ which will split up symmetrically toward both sides, with the two lines moving to the right and to the left up to the threshold value $f_O+f_M$ and $f_O-f_M$, respectively, from where they return to the center at the end of the saw tooth.

Figure 5A:
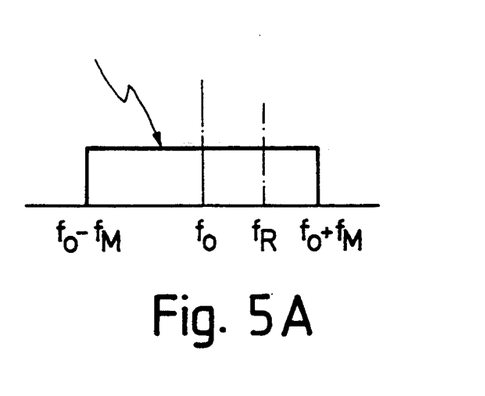
FIGS. 5A and 5B, 6A and 6B, 7A and 7B show representations of the frequency range, similar to that of FIG. 4, and of mode curves according to the present invention, for a total of three operating instances.

We will now regard three different operating conditions of the arrangement 40, which are represented very diagrammatically in FIGS. 5A to 7B:

FIG. 5A depicts a first operating condition where the resonance frequency $f_R$ of the microwave resonator 42 is on the right side of the basic frequency $f_O$ of the microwave source 41, but still within the frequency band 50.

Figure 5B:
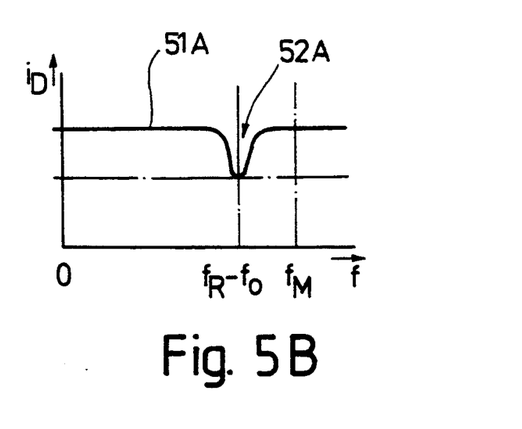

The signal $i_D$ now developing when tuning the oscillator 45 with the frequency $f_S$ can be seen in FIG. 5B, the latter showing a curve 51A representing the tuning range, i.e. the range between the frequencies 0 and $f_M$ at the output of the oscillator 45. Now, a dip 52A occurs at the frequency $f_F-f_O$. This is the point where the resonator 42 has come to resonate and has absorbed power.

Figure 6A:
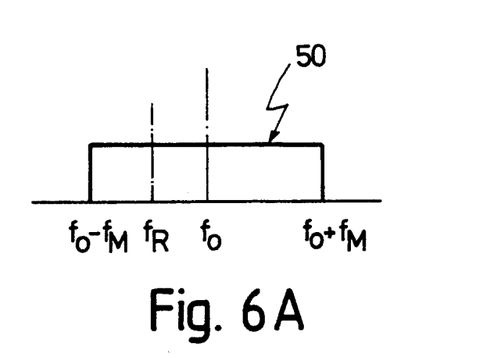
Figure 6B:
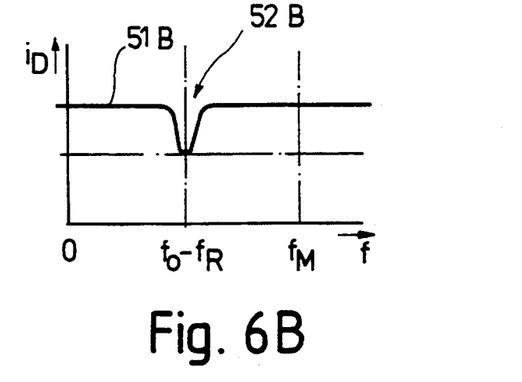

The same applies correspondingly to a second operating condition, as illustrated in FIG. 6A. In this case, the resonance frequency $f_R$ of the resonator 42 is found at the left of the basic frequency $f_O$, but still within the frequency band 50. This fact finds its expression in the curve 51B of the signal $i_D$, as illustrated in FIG. 6B, by a dip 52B at the point $f_O-f_R$. The fact that the two representations 5B and 6B are almost identical, although the resonance frequency $f_R$ was found once at the right and once at the left of the basic frequency $f_O$ (FIGS. 5A and 6A, respectively) is due to the phenomenon discussed above, namely that during tuning of the oscillator 45 the frequency line splits up uniformly to both sides of the basic frequency $f_O$. Consequently, the point of resonance is always passed during each sweep of the sweep generator 46, whether it is at the right or at the left of the basic frequency $f_O$, because the partial lines have moved away from the basic frequency $f_O$ in both directions.

This also is the reason for the relatively small depth of the dips 52A, 52B, as due to the modulation that has been explained several times before, only half of the power of the respective resonance frequency $f_R$ is present.

Figure 7A:
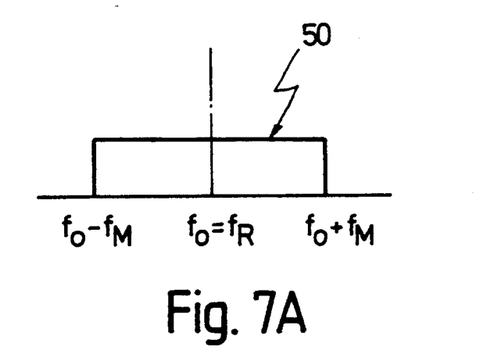

Now, FIG. 7A shows the case where the resonance frequency $f_R$ was consistent with the basic frequency $f_O$ from the very beginning, or the necessary tuning has already been effected.

Figure 7B:
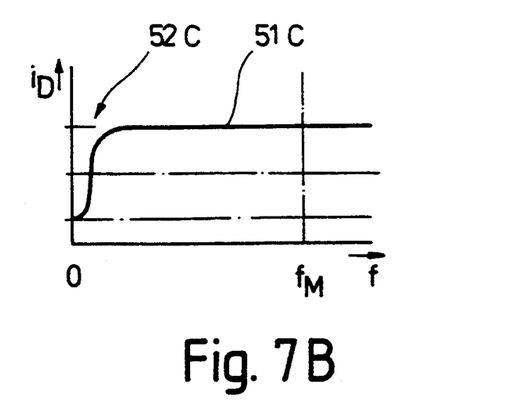

The curve 51C of the signal $i_D$, as depicted in FIG. 7B, now contains a dip 52C in the neighborhood of the zero point. In addition it deserves to be noted that the dip 52C is twice as deep as the dips 52A and 52B in FIGS. 5B and 6B. This is also due to the phenomenon described before, that at the basic frequency $f_O$ there is only a single frequency line which, consequently, represents the full microwave power.

Figures 8, 9:
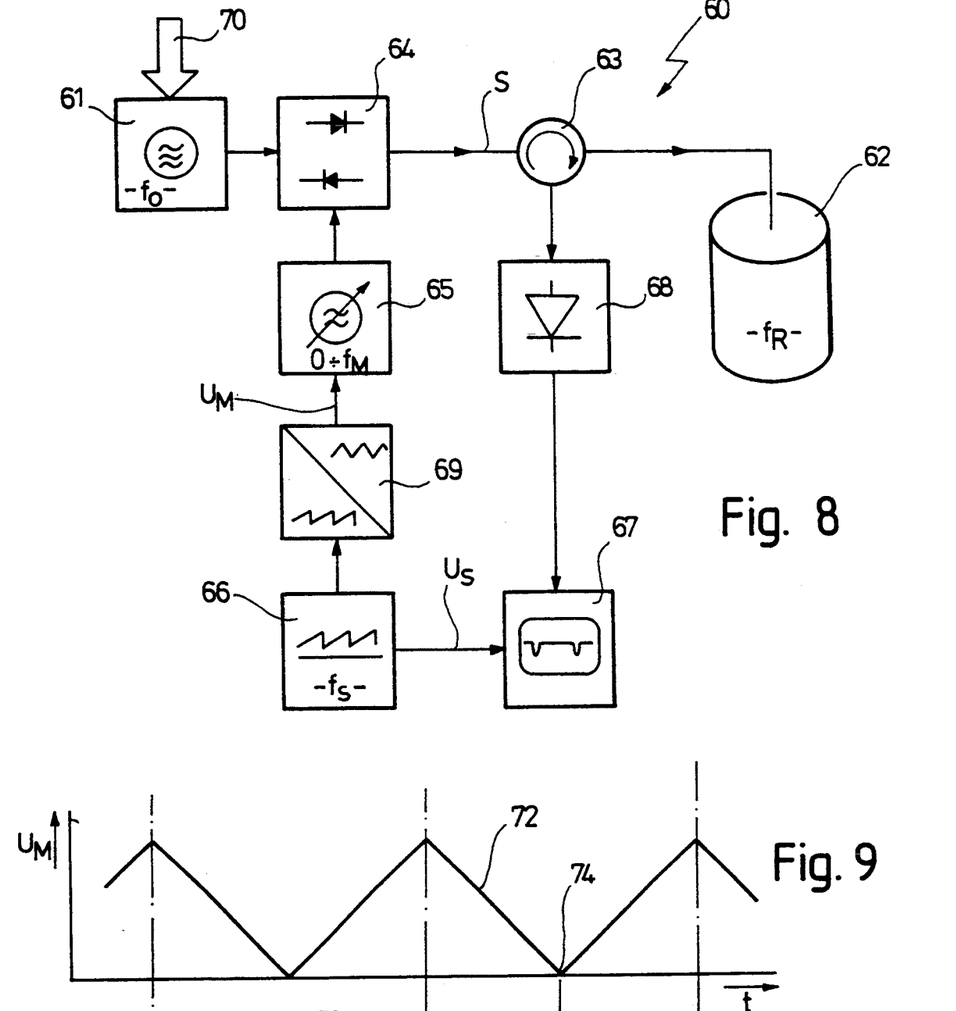
FIG. 8 shows another block diagram, similar to that of FIG. 1, but for another embodiment of the invention.
FIGS. 9 and 10 show curves of control voltages of the kind employed in the block diagram of FIG. 8.

FIG. 8 shows a second embodiment of the microwave circuit arrangement 60, corresponding largely to the one illustrated in FIG. 3.

Again, a microwave source 61 feeds a microwave resonator 62 via a circulator 63. Again, a mixer 64 is connected between the circulator 63 and the microwave source 61. The mixer 64 is driven by a tunable oscillator 65, which in its turn is influenced by a sweep generator 66. The sweep generator 66 is connected to a visual display unit 67. This is also true for a detector 68 connected between the circulator 63 and the visual display unit 67. There is also provided a coarse frequency setting means 70 for the microwave source 61.

Compared with the block diagram of FIG. 3, the one of FIG. 8 distinguishes itself by a transformer 69 connected between the sweep generator 66 and the tunable oscillator 65. It is the function of the transformer 69 to convert the saw-tooth voltage of the sweep generator with respect to its waveshape and/or frequency.

Figure 10:
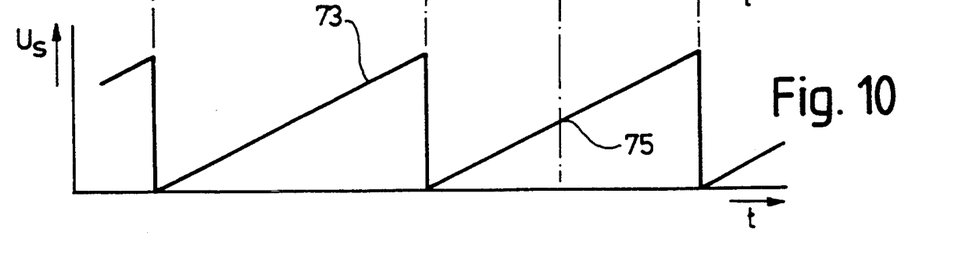
Figure 11:
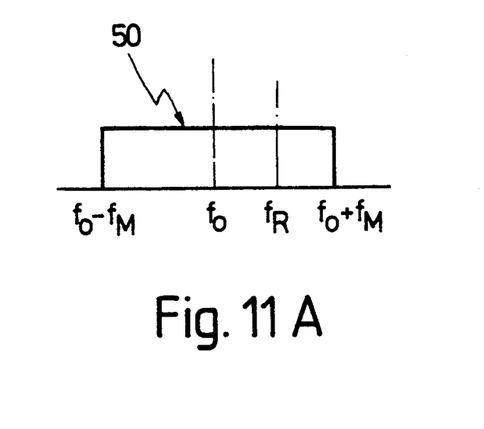
FIGS. 11A and 11B, 12A and 12B, 13A and 13B show representations similar to those of FIGS. 5A to 7B, but for the embodiment of the invention illustrated in FIG. 8.

One example for this is illustrated in FIGS. 9 and 10. While $U_S$ in FIG. 10 represents the saw-tooth voltage as a function of time, FIG. 9 shows the output voltage $U_M$ of the transformer 69. As will be easily seen, the output voltage $U_M$ is a triangular voltage.

Now, comparing the voltages $U_S$ and $U_M$, the frequency at which a sweep process is run through is doubled because in the case of the saw-tooth voltage $U_S$ the entire rise was utilized for running through the frequency, for example of the tunable oscillator, while during the same period of time the triangular voltage $U_M$ dropped from the maximum value to the minimum value and rose again to the maximum value so that the frequency range was run through twice. Further, the curve 72 of the signal $U_M$ and 73 of the signal $U_S$ are synchronized so that the zero point 74, or the minimum of the triangular voltage $U_M$, just coincides in time with the sweep center 75 of the saw-tooth voltage $U_S$.

This measure has the following effect:

FIGS. 11A to 13B show once more three operating conditions corresponding to those illustrated in FIGS.

5A to 7B, FIGS. 11A, 12A and 13A being identical to FIGS. 5A, 6A and 7A.

In the first operating condition illustrated in FIG. 11A it will be seen, however, that two dips 81AL and 81AR appear in the curve 80A of the signal $i_D$. This is due to the fact that the frequency range between zero and $f_M$ has been run through twice during one sweep of the visual display unit 47, i.e. during the period of one saw tooth at the output of the sweep generator 46.

Figure 12:
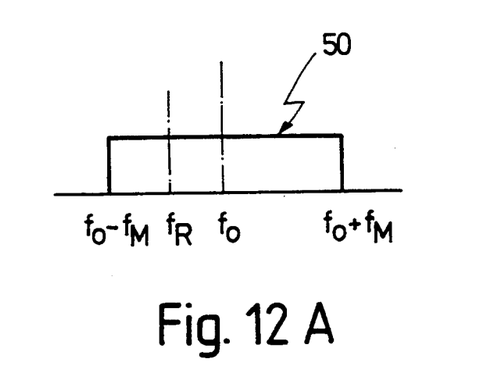
Figure 13:
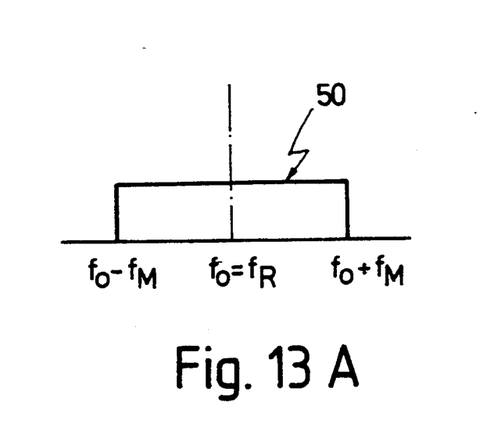

The same is true by analogy for the second case illustrated in FIG. 12A, where two dips 81BL and 81BR can be seen in the respective signal curve 80B according to FIG. 12. Here again, it can be said that the dip spacings do not permit any conclusion as to the sense of deviation of the resonance frequency $f_R$ from the basic frequency $f_O$, but provide a measure for the absolute amount by which the resonance frequency $f_R$ deviates from the basic frequency $f_O$, without regard to the sense of deviation.

FIG. 13B finally shows the resonance case where the basic frequency $f_O$ conforms to the resonance frequency $f_R$. It can be seen that there remains only a single dip 81C in the curve 80C, having again twice the depth of the dips 81AL, 81AR, 81BL and 81BR in FIGS. 11B and 12B.

All in all, this means that when tuning the arrangement 60, there will initially appear two dips in the marginal area of the display image, which dips will move symmetrically to the center, as tuning is improved, i.e. as $f_R$ and $f_O$ approach each other, and which will finally merge, doubling their depth, when the resonance point is reached according to FIGS. 13A and 13B.

The representation if FIG. 13B further has the advantage that it conforms largely to the conventional mode curve 30 according to FIG. 2 so that it also looks like the curve the user is used to.

We claim:

1. A method for tuning a circuit including
    a first HF source (41) generating a first HF signal of a first HF frequency ($f_O$),
    a second HF source (45) being adjustable in frequency and generating a second HF signal of a second HF frequency ($f_M$), said second HF source having a frequency modulation input,
    a sweep generator (46) for generating an audio frequency sweep signal and an audio frequency modulation signal, said sweep generator in communication with said frequency modulation input,
    a mixer (44),
    a narrow-band HF component (42), and
    display means (47) having Y and X inputs for displaying a tuning signal,
    the method comprising the steps of:
        modulating said second HF frequency at a rate of said audio frequency modulation signal to generate a modulated second HF signal;
        mixing said first HF signal with said modulated second HF signal to generate a mixed HF signal (S);
        absorbing said mixed HF signal;
        reflecting a tuning signal corresponding to the power of said mixed HF signal absorbed by said narrow-band HF component as a function of time;
        using said tuning signal as an input to said Y-input and using said audio frequency sweep signal as an input to said X-input of said display means for displaying a mode curve with at least one dip therein, said dip having a depth value within said mode curve; and
        adjusting said second HF frequency of said second HF source to a maximum value of said depth value.

2. The method of claim 1, wherein said sweep signal and said modulation signal are both sawtooth signals of same audio frequency and said adjusting step includes the step of adjusting said second HF frequency to a position of said dip on an X end position of said display means.

3. The method of claim 1, wherein said sweep signal is a sawtooth signal of a first audio frequency and said modulation signal is an alternating signal of a second audio frequency being twice the frequency of said first audio frequency, said adjusting step including the step of adjusting said second HF frequency to a position where a first dip and a second dip within said mode curve are brought into coincidence.

4. A method for tuning a microwave bridge of an electron spin resonance spectrometer including
    a first microwave source generating a first microwave signal of a first microwave frequency,
    a second microwave source being adjustable in frequency in generating a second microwave signal of a second microwave frequency, said second microwave source having a frequency modulation input,
    a sweep generator for generating an audio frequency sweep signal and an audio frequency modulation signal, said sweep generator in communication with said frequency modulation input,
    a mixer,
    a microwave resonator, and
    display means having Y and X inputs for displaying a tuning signal,
    the method comprising the steps of:
        modulating said second microwave frequency at a rate of said audio frequency modulation signal to generate a modulated second microwave signal;
        mixing said first microwave signal with said modulated second microwave signal to generate a mixed microwave signal;
        absorbing said mixed microwave signal;
        reflecting a tuning signal corresponding to the power of said mixed microwave signal absorbed by said microwave resonator as a function of time;
        using said tuning signal as an input to said Y-input and using said audio frequency sweep signal as an input to said X-input of said display means for displaying a mode curve with at least one dip therein, said dip having a depth value within said mode curve; and
        adjusting said second microwave frequency of said second microwave source to a maximum value of said depth value.

5. The method of claim 4, wherein said sweep signal and said modulation signal are both sawtooth signals of same audio frequency and said adjusting step includes the step of adjusting said second microwave frequency to a position of said dip on an X end position of said display means.

6. The method of claim 4, wherein said sweep signal is a sawtooth signal of a first audio frequency and said modulation signal is an alternating signal of a second audio frequency being twice the frequency of said first audio frequency, said adjusting step including the step of adjusting said second microwave frequency to a position where a first dip and a second dip within said mode curve are brought into coincidence.

7. An apparatus for tuning a circuit including
a first HF source (61) generating a first HF signal of a first HF frequency ($f_O$),
a second HF source (65) being adjustable in frequency and generating a second HF signal of a second HF frequency ($f_M$), said second HF source having a frequency modulation input,
a sweep generator for generating an audio frequency sweep signal ($U_S$) and an audio frequency modulation signal ($U_M$), said sweep generator being in communication with said frequency modulation input,
a narrow-band HF component (62), and
display means (67) having Y and X inputs for displaying a tuning signal,
the apparatus further comprising:
means for modulating said second HF frequency at a rate of said audio frequency modulation signal to generate a modulated second HF signal by connecting said sweep generator to said frequency modulation input of said second HF source;
means for mixing said first HF signal with said modulated second HF signal within said mixer to generate a mixed HF signal (S);
means for feeding said mixed HF signal to said narrow-band HF component;
means for detecting a tuning signal corresponding to the power of said mixed HF signal absorbed by said narrow-band HF component as a function of time;
means for feeding said tuning signal to said Y-input and feeding said audio frequency sweep signal to said X-input of said display means for displaying a mode curve with at least one dip therein, said dip having a depth value within said mode curve; and
means for adjusting said second HF frequency of said second HF source to a maximum value of said depth value.

8. The apparatus of claim 7, wherein said sweep signal and said modulation signal are both sawtooth signals of same audio frequency and said adjusting means includes means for adjusting said second HF frequency to a position of said dip on an X and position of said display means.

9. The apparatus of claim 7, wherein said sweep signal is a sawtooth signal of a first audio frequency and said modulation signal is an alternating signal of a second audio frequency being twice the frequency of said first audio frequency, said adjusting means including means for adjusting said second HF frequency to a position where a first dip and a second dip within said mode curve are brought into coincidence.

10. An apparatus for tuning a microwave bridge of an electron spin resonance spectrometer including
a first microwave source generating a first microwave signal of a first microwave frequency,
a second microwave source being adjustable in frequency and generating a second microwave signal of a second microwave frequency, said second microwave source having a frequency modulation input,
a sweep generator for generating an audio frequency sweep signal and an audio frequency modulation signal, said sweep generator in communication with said frequency modulation input,
a microwave resonator, and
display means having Y and X inputs for displaying a tuning signal,
the apparatus comprising:
means for modulating said second microwave frequency at a rate of said audio frequency modulation signal to generate a modulated second microwave signal;
means for mixing said first microwave signal with said modulated second microwave signal to generate a mixed microwave signal;
a microwave resonator for absorbing said mixed microwave signal, and for reflecting a tuning signal corresponding to the power of said mixed microwave signal absorbed by said microwave resonator as a function of time;
display means, receiving said tuning signal to said Y-input and receiving said audio frequency sweep signal to said X-input, said display means for displaying a mode curve with at least one dip therein, said dip having a depth value within said mode curve; and
means for adjusting said second microwave frequency of said second microwave source to a maximum value of said depth value.

11. The spectrometer of claim 10, wherein said sweep signal and said modulation signal are both sawtooth signals of same audio frequency and said adjusting means includes means for adjusting said second microwave frequency to a position of said dip on an X end position of said display means.

12. The spectrometer of claim 10, wherein said sweep signal is a sawtooth signal of a first audio frequency and said modulation signal is an alternating signal of a second audio frequency being twice the frequency of said first audio frequency, said adjusting means comprising means for adjusting said second microwave frequency to a position where a first dip and a second dip within said mode curve are brought into coincidence.

13. A method for tuning HF circuit, comprising the steps of:
generating an audio frequency sweep signal ($U_S$) and an audio frequency modulation signal ($U_M$);
generating a first HF signal having a first HF frequency ($f_O$);
generating a second HF signal having a second HF frequency ($f_M$);
modulating said second HF frequency at a rate of said audio frequency modulation signal to generate a modulated second HF signal;
mixing said first HF signal with said modulated second HF signal to generate a mixed HF signal (S);
absorbing said mixed HF signal;
generating a tuning signal corresponding to the amount of power, associated with said mixed HF signal, absorbed as a function of time;
using said audio frequency sweep signal and said tuning signal to display a mode curve having at least one dip therein, said dip having a depth value within said mode curve; and
adjusting said second HF frequency of said second HF source to a maximum value of said depth value.

14. An apparatus for tuning an HF circuit, comprising:
a sweep generator for outputting an audio frequency sweep signal and an audio frequency modulation signal;
a first HF source for outputting a first HF signal of a first HF frequency;

a second HF source responsive to said audio frequency modulation signal and operative to modulate a second HF frequency, of an internally generated second HF signal, at a rate of said audio frequency modulation signal thereby outputting a modulated second HF signal;

a mixer for mixing said first HF signal with said modulated second HF signal, and operative to generate a mixed HF signal;

a narrow-band HF component responsive to said mixed HF signal, and operative to absorb a portion of said mixed HF signal and to reflect another portion of said mixed HF signal as a tuning signal, such that said tuning signal corresponds to the power of said mixed HF signal absorbed by said narrow-band HF component as a function of time;

display means having Y and X inputs for receiving said tuning signal at said Y-input and receiving said audio frequency sweep signal at said X-input, said display means for displaying a mode curve with at least one dip therein having a depth value within said mode curve; and means for adjusting said second HF frequency of said second HF source to generate a maximum value of said depth value.

* * * * *